US006894518B1

(12) United States Patent
Bruce et al.

(10) Patent No.: US 6,894,518 B1
(45) Date of Patent: May 17, 2005

(54) CIRCUIT ANALYSIS AND MANUFACTURE USING ELECTRIC FIELD-INDUCED EFFECTS

(75) Inventors: Michael R. Bruce, Austin, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 55 days.

(21) Appl. No.: 10/113,780

(22) Filed: Mar. 29, 2002

(51) Int. Cl.$^7$ .............................................. G01R 31/26
(52) U.S. Cl. ....................... 324/765; 324/750; 382/145
(58) Field of Search ................................ 324/750, 752, 324/753, 751, 765, 754, 58.1; 382/145, 147, 149, 141, 144; 250/310, 311, 306, 307; 356/124; 73/105

(56) References Cited

U.S. PATENT DOCUMENTS

| | | | |
|---|---|---|---|
| 4,999,577 A | * 3/1991 | Beha et al. | 324/752 |
| 5,122,737 A | * 6/1992 | Clauberg | 324/767 |
| 5,296,704 A | * 3/1994 | Mishima et al. | 250/306 |
| 5,301,006 A | 4/1994 | Bruce | |
| 5,753,814 A | * 5/1998 | Han et al. | 73/105 |
| 5,760,892 A | * 6/1998 | Koyama | 356/237.1 |
| 6,107,107 A | * 8/2000 | Bruce et al. | 438/14 |
| 6,369,591 B1 | * 4/2002 | Cugini et al. | 324/752 |
| 6,469,536 B1 | * 10/2002 | Kessler et al. | 324/765 |
| 6,724,928 B1 | * 4/2004 | Davis | 382/145 |
| 6,747,464 B1 | * 6/2004 | Blackwood | 324/752 |

OTHER PUBLICATIONS

1998, R. Wiesendanger, Ed., *Scanning Probe Microscopy*, Springer Verlag (No Copy Available).
1997, *International Symposium for Testing and Failure Analysis* (ISTFA) p. 159 (No Copy Available).
1990, *International Symposium for Testing and Failure Analysis* (ISTFA) p. 121 (No Copy Available).

\* cited by examiner

*Primary Examiner*—David Zarneke
*Assistant Examiner*—Jimmy Nguyen

(57) ABSTRACT

Circuitry within a semiconductor die is analyzed by applying an electric field without necessarily directly accessing the circuitry. According to an example embodiment of the present invention, an electric field is applied to a semiconductor die and used to stimulate circuitry therein. A photoemission response of the die to the electric field is detected and used to detect an electrical characteristic of the die. This is particularly useful in applications where it is desired to direct stimulation to the die from an external source and to also externally detect a response of the die to the stimulation. In this manner, the die can be tested without necessarily directly contacting the die and, when the electric field is applied in a scanning mode over the die, can be effected without necessarily knowing the location of a defect in the die.

26 Claims, 3 Drawing Sheets

CIRCUIT ANALYSIS AND MANUFACTURE USING ELECTRIC FIELD-INDUCED EFFECTS

FIELD OF THE INVENTION

The present invention relates generally to semiconductor devices and their fabrication and, more particularly, to testing and defect analysis of semiconductor dies.

BACKGROUND OF THE INVENTION

Recent technological advances in the semiconductor industry have permitted highly functional, high-density circuit arrangements for integrated circuits, microprocessors and other semiconductor device applications. A by-product of such high functionality and high density is an increased demand for products employing these devices for use in numerous applications. As the use of these devices has become more prevalent, the demand for faster operation and better reliability of the devices has also increased. In addition, such devices often require manufacturing processes that are highly complex and expensive.

As the manufacturing processes for semiconductor devices and integrated circuits increase in difficulty, methods for testing and debugging these devices become increasingly important. Not only is it important to ensure that individual dies are functional, it is also important to ensure that batches of dies perform consistently. In addition, the ability to detect a defective manufacturing process early is helpful for reducing the number of defective devices manufactured.

Traditionally, integrated circuits have been tested using methods including directly accessing circuitry and/or using devices within the integrated circuit to access circuitry. These testing methods are used for designing new devices as well as for debugging manufacturing processes for existing designs. Test results obtained using these testing methods are used for identifying defects in a circuit design or in a circuit manufacturing process, which in turn is used for modifying the design and/or manufacturing process. The modified designs are used for new prototypes, which are in turn tested and re-designed as needed.

Directly accessing circuitry for device testing and analysis is difficult for several reasons. For instance, in high-density circuit applications, it is difficult to accurately navigate stimulus sources to particular circuit nodes. In addition, it is sometimes necessary to destroy a portion of the die in order to access circuit nodes, such as when accessing circuitry in a conventional die via a die passivation layer. In flip chip type dies, transistors and other circuitry are located in a very thin epitaxially grown silicon layer in a circuit side of the die, which is arranged face-down on a package substrate. Transistors and other circuitry near the circuit side are not readily accessible for testing, modification, or other purposes due to this face-down orientation. Therefore, access to the transistors and circuitry near the circuit side is from the back side of the die.

Another particular type of semiconductor device structure that presents unique challenges to circuit analysis is silicon-on-insulator (SOI) structure, wherein circuitry is located in a thin layer of silicon formed on an insulator, such as oxide. SOI structure exhibits benefits including reduced switch capacitance that leads to faster operation. However, direct access to circuitry for analysis of SOI structure involves milling through the insulator, which can damage circuitry or other structure in the device. Such damage can alter the characteristics of the device and render analysis of the device inaccurate. In addition, the milling process can be time-consuming, difficult to control and expensive.

The difficulty, cost, and destructive aspects of existing methods for testing integrated circuits are impediments to the growth and improvement of semiconductor technologies, including those involving flip-chip structures, conventional structures and SOI structures.

SUMMARY OF THE INVENTION

The present invention is directed to analyzing a semiconductor die in a manner that overcomes the impediments discussed above. The present invention is exemplified in a number of implementations and applications, some of which are summarized below.

According to an example embodiment of the present invention, a semiconductor die is analyzed using an externally-applied electric field and a photoemission detector. The electric field is applied to the die using a source, separate from the die, and the electric field stimulates circuitry in the die. A photoemission response of die to the applied electric field is detected and used to detect an electrical characteristic of the die. For example, an open gate can be detected and identified or verified using the applied electric field as a second gate to bias a channel region below the open gate. In addition, a variety of other circuit characteristics, such as a gate having an oxide short or an interconnect having a short or open circuit, can also be detected. In each of these examples, the circuit analysis can be carried out without necessarily removing any substrate from the die and is useful, for instance, in analyzing prototype die designs for modification and implementation to large scale production. With this approach, challenges to the design and manufacture of semiconductor devices, including those impediments discussed above, can be addressed.

In another example embodiment of the present invention, the electric field is scanned over the die to stimulate a plurality of circuit nodes in the die. Responses from the die are mapped to the particular circuit node being scanned at the time the responses are detected. The mapped responses can then be used to identify operating characteristics of the circuit node, which are then used to analyze the die, such as to determine whether or not the die is operating properly under particular conditions, or to determine the susceptibility of the die to failure.

In another example embodiment of the present invention, a semiconductor die is manufactured using the techniques for analysis described herein. Circuit characteristics of the die detected using the applied electric field stimulation and the photoemission response are used to modify the design and/or manufacturing process for the die. Additional dies are then manufactured using the modified design and/or manufacturing process.

According to another example embodiment of the present invention, a system is adapted for analyzing a semiconductor die with an externally-applied electric field and a photoemission detector. The system includes an electric field application tool, such as a scanning electric force microscope probe, separate from the die and configured and arranged for applying an electric field to the die. The electric field tool is adapted for stimulating circuitry in the die, and photoemission detector is adapted for detecting a photoemission response of die to the stimulation. A computer arrangement is adapted for using the response to detect an electrical characteristic of the die.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
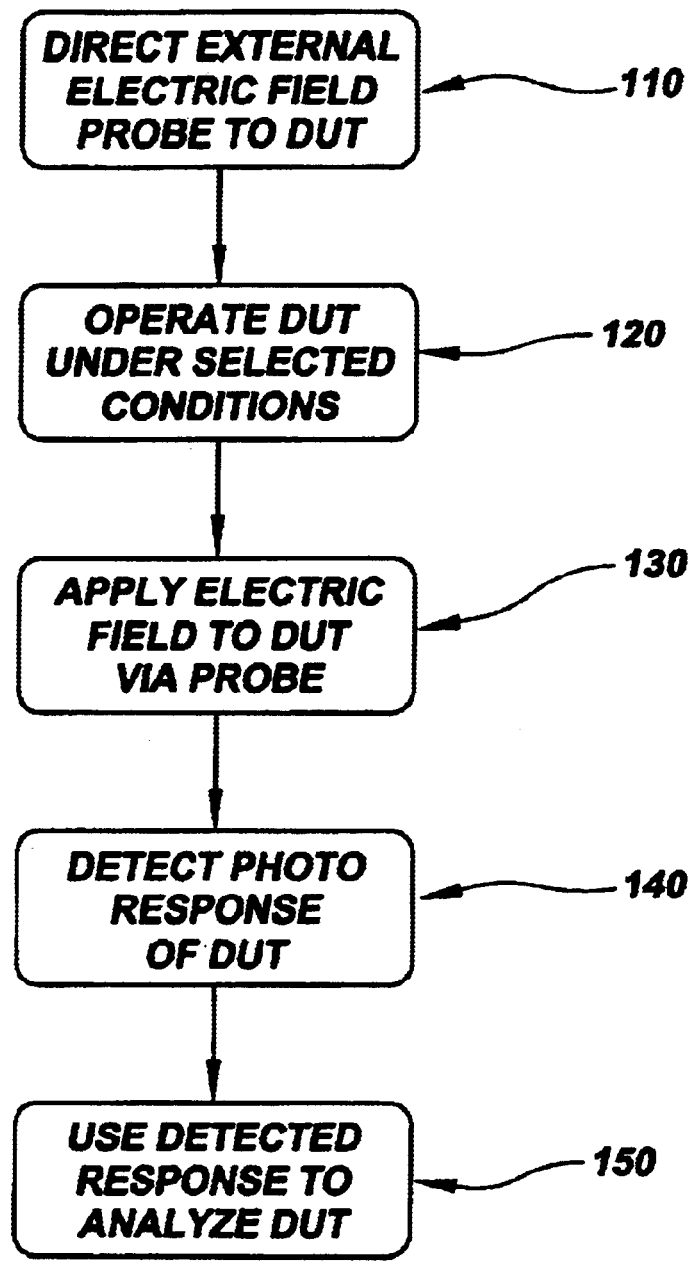
FIG. 1 is a flow diagram for semiconductor die analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices benefiting from analysis without necessarily directly contacting circuitry in the device. While the present invention is not necessarily limited to such devices, various aspects of the invention may be appreciated through a discussion of exemplary implementations using this context.

According to an example embodiment of the present invention, an electric field is applied to a semiconductor die using an external source, and a photoemission response of the die to the externally-applied electric field is detected. The electric field is applied to one or more circuit nodes in the die by directing the external source to the circuit node. The source is positioned to stimulate a circuit node in the die, and in one implementation, is scanned over several circuit nodes in the die. The stimulation causes a state change in the die, which in turn generates the photoemission response (e.g., resulting from a change in the energy level of electrons located in an active region of the die). The photoemission response of the die is detected and used to identify a circuit characteristic of the die, such as a characteristic related to a malfunction in die design and/or in die manufacture. In addition, the photoemission response can be traced back to the circuit node being stimulated by the external source when the photoemission is detected. With this approach, the response can be mapped to a particular portion of the die including the circuit node and/or to a portion of the die electrically coupled to or otherwise affected by (e.g., via a capacitively coupled signal) the circuit node being stimulated.

The present invention is applicable to a variety of different types of semiconductor dies, including conventionally-packaged dies, flip-chip packaged dies and dies having silicon-on-insulator structure. In each of these applications, the electric field is directed in a manner that is suited for each die. For example, it may be useful to first remove a portion of a die, such as a portion of a back side of a flip-chip die, in order to expose or nearly expose circuit nodes to which the electric field is to be applied. In addition, the strength of the applied electric field can be varied to stimulate a circuit node buried below substrate, circuitry or other material in the die, if the type and arrangement of the die being analyzed so requires.

In a more particular example embodiment of the present invention, the circuit condition detected in the example embodiment discussed above is used for modifying the design of the die. This modification may, for example, reduce or eliminate a defect or defects related to the detected circuit condition. The modified design is then used to manufacture one or more additional dies, which in turn can be similarly analyzed. Once the design is deemed sufficient for large-scale manufacturing, dies are then manufactured for implementation in a variety of applications.

In another more particular example embodiment of the present invention, the circuit condition detected in the example embodiment discussed above is used to identify a defective die manufacturing process. For example, the detection of a particular circuit characteristic in the analyzed die that exceeds a selected threshold may indicate that a particular operating parameter in the manufacturing process is unacceptable. Once the defective process is identified, it is modified to reduce or eliminate the defect.

FIG. 1 is a flow diagram for analyzing a device under test (DUT), such as an integrated circuit die, according to another example embodiment of the present invention. At block 110, an external electric field probe (e.g., an electric force microscope) is directed to the DUT. The probe is directed using, for example, a circuit layout of the DUT to navigate to a portion of circuitry therein and/or a scanning approach, wherein the electric field probe is scanned across a portion of the DUT. In one implementation, the probe is directed to the DUT using nanoscale resolution (e.g., positioning the probe within a few nanometers of a selected circuit node or nodes). This approach is particularly useful in applications where stimulation is to be limited to a particular area of the die, which is accomplished using a sufficiently small probe tip. For general information regarding semiconductor device analysis and manufacture, and for specific information regarding the use of nanoscale resolution for positioning a probe tip, reference may be made to U.S. patent application Ser. No. 10/086,505 filed on Feb. 28, 2002.

Using signals applied to inputs of the DUT, the DUT is operated at block 120 under selected operating conditions, such as under conditions known to cause the die to be susceptible to failure or under conditions typical for normal operating implementations to which the die is to be applied. An electric field is applied to the DUT via the external electric field probe at block 130, and a photo response of the DUT is detected at block 140. The photo response is then used to analyze an electrical characteristic of the DUT, such as the confirmation of proper operation and/or the detection of a defect, such as a short circuit, an open circuit and/or a non-functioning transistor.

In one implementation, the electric field applied at block 130 biases a channel region of a transistor in the DUT. This approach is useful for controlling a change in the electrical state of the transistor, thereby controlling current flow in the device. For example, the channel of a transistor can be switched to a conducting state by creating a conductive channel therein and/or prevented from being switched into a conducting state by deleting carriers in the channel region. With this approach, defective transistor gates can be detected and identified as photoemissions that result from the transistor switching on in response to the applied electric field. In addition, an electric field of sufficient strength can be used to maintain a transistor in a particular state (e.g., in an "on" or conducting state), even when internal signals are applied to the transistor, which is particularly useful for holding at transistor at a selected state for test purposes.

In another implementation, the signals applied to the inputs of the DUT at block 120 are halted and the operation of the die is thus halted in a selected state. This approach is particularly useful for identifying circuitry that fails to take on a selected state at the halted point of operation. The external electric field is used to switch the failed circuitry, and the photoemission response of the die is used to identify which circuit has been switched.

In still another implementation, the signals applied to the inputs of the DUT at block 120 are applied to operate the DUT in a loop that is known to cause the die to be susceptible to failure. The electric field stimulation is used to slow the state transition of a particular circuit portion in the die, and a photoemission response of the die to the slowed state transition is detected. The timing of the photoemission response of the die is compared to a reference time for a properly-operating die. When the response time is different than the reference time by a difference that is greater than a particular threshold difference (e.g., an acceptable amount of timing delay), the circuit portion is identified as being susceptible to failure. This approach is particularly useful for detecting circuit elements that are susceptible to timing failures as a result of factors that tend to slow the operation of the die, such as heat or electric fields.

In another more particular example embodiment of the present invention, the external electric field is applied at block 130 using a scanning approach, where a scanning probe arrangement is used to scan the electric field across the die. As a result of the electric field being scanned, the detected response at block 140 varies as the electric field is applied to different circuit nodes. For example, as circuit nodes are stimulated and the stimulation is subsequently removed, those circuit nodes may undergo a state change, such as when stimulating a transistor as discussed above. In this implementation, the detected response is mapped to the location of the probe and used to identify a circuit portion of the DUT that responds to the stimulation. The mapping may be effected, for example, using a circuit diagram and an image of the detected photoemissions, using an imaging device that collects light from the die simultaneously with the photoemission detection, and/or using an integration of an electric signal representing photoemission responses from the die (e.g., integrating a signal from a photo-detector) to create an image of the photoemission responses. These approaches are particularly useful in applications where the location of a defective circuit is unknown. In addition, the mapping can also be carried out in three dimensions, such that the circuit location of a DUE having multiple layers can be identified, e.g., by varying the distance between the probe and the DUT or by changing strength of the external electric field.

As discussed above, the electric field stimulation is applicable to many different devices, such as conventionally packaged dies, flip-chip packaged dies and dies having silicon-on-insulator (SOI) structure. If necessary, a packaged die being analyzed is prepared for the type of analysis to be performed, and the preparation may be directed to one or both of stimulating the die with the applied electric field and detecting a photoemission response from the die. In one instance, a portion of a packaged die is removed to expose a region in the die via which the electric field is applied. For conventionally packaged dies, this involves applying the electric field via a portion of a chip passivation layer where some of the passivation layer has been removed. For flip-chip packaged dies, a portion of a backside that is opposite a circuit side (arranged face-down on a package substrate) is removed, and the electric field is applied via the removed portion of the backside. For general information regarding implementations to which the present invention is applicable, and for specific information regarding the removal of substrate for preparing a die for analysis in connection with the present invention, reference may be made to U.S. patent application Ser. No. 09/997,715 (AMDA.504PA/TT4056), filed Nov. 28, 2001 and entitled "Method of Substrate Silicon Removal for Integrated Circuit Devices," which is fully incorporated by reference.

Figure 2:
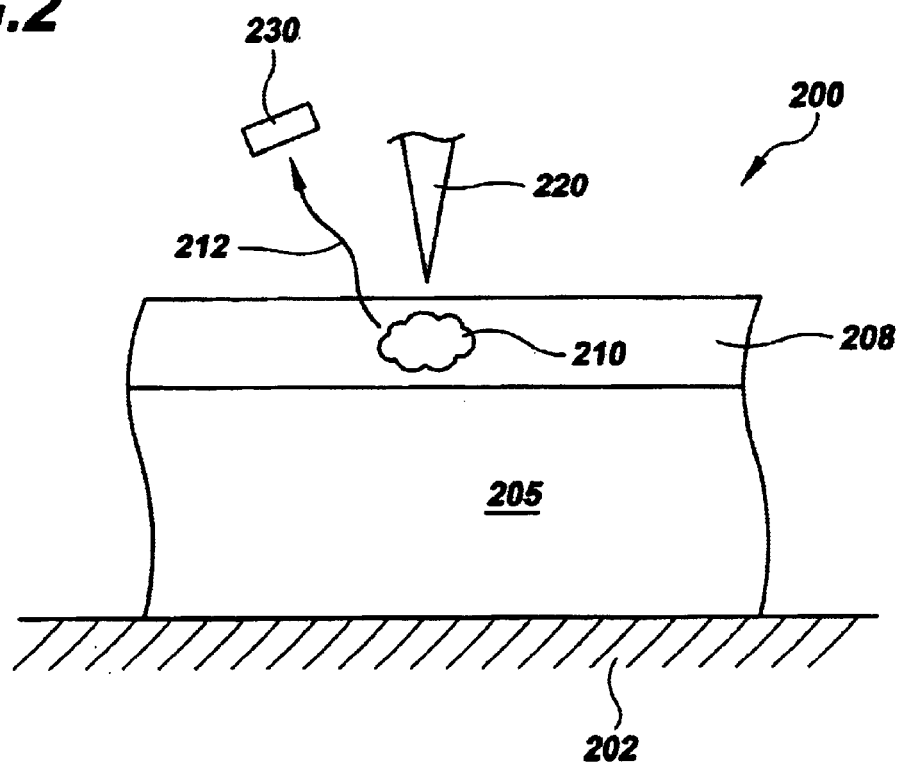
FIG. 2 is a conventionally packaged semiconductor die undergoing analysis, according to another example embodiment of the present invention.

FIG. 2 shows a semiconductor die 200 conventionally packaged to a substrate 202 and undergoing stimulation from an electric force microscope (EFM) probe tip 220 (only a portion of which is shown for brevity), according to another example embodiment of the present invention. The die 200 includes a circuit portion 210 located in a passivation layer 208 of a circuit side of the die 200. The die 200 is operated, the EFM probe tip 220 is scanned over the circuit portion 210 and a change in an electrical characteristic of the die 200 in response to an electric field applied via the EFM probe tip 220 generates a photoemission 212. The photoemission 212 is detected at a detector 230 and used to detect a condition of circuitry in the die that results in a state change or other operation that generates the photoemission, resulting either directly or indirectly from the applied electric field. For example, a defective transistor in the circuitry 210 that fails to bias a transistor channel region when operated is detected as the EFM probe tip biases the channel, thereby changing the electrical state of the circuitry 210 and generating a photoemission 212.

Figure 3A:
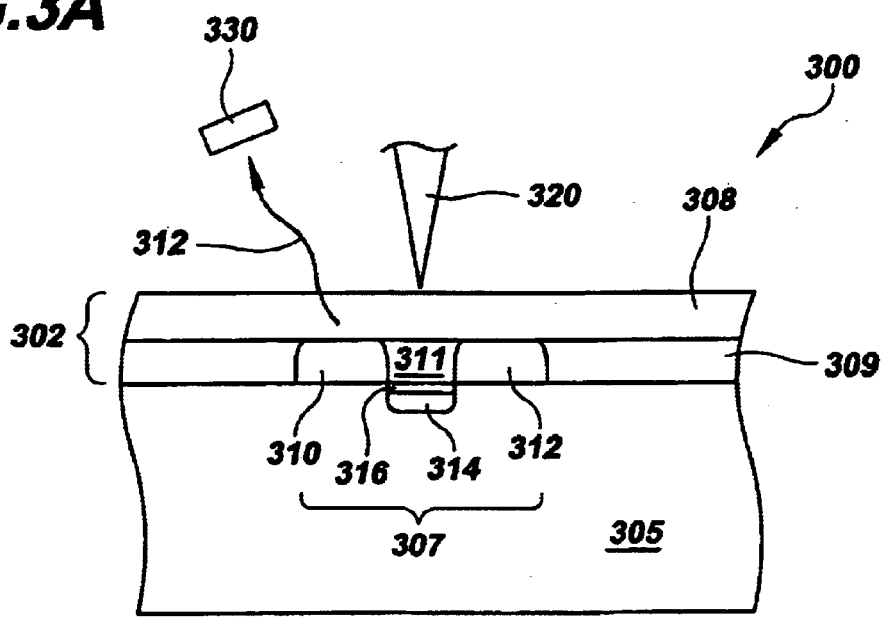
FIG. 3A is a semiconductor die having silicon-on-insulator (SOI) structure undergoing analysis, according to another example embodiment of the present invention.

FIG. 3A shows a semiconductor die 300 undergoing analysis, the die having SOI structure and a defective transistor 307 located in a circuit side 302 of the die that is opposite a back side 305 of the die, according to another example embodiment of the present invention. The transistor 307 includes source/drain regions 310 and 312 separated by a channel region 311, with the channel region 311 being separated from a gate 314 by a gate dielectric material 316. The source/drain regions are located in a silicon layer 309 immediately adjacent to an insulator layer 308 of the SOI structure. Electrical connections to the source/drain regions 310 and 312, as well as to the gate 314, have not been shown for brevity. The die is thinned to expose the insulator layer 308, and the die is operated (e.g., under normal operating conditions and/or under conditions known to cause a failure). An EFM probe tip 320 is scanned over the insulator 308 and over the channel region 311 in a manner similar to that discussed above. As the EFM probe tip 320 is scanned across the channel region, it acts as a second gate and turns the transistor on, biasing the channel region 311 and closing a circuit between the source/drain regions 310 and 312. An electrical response to the transistor being turned on generates a photoemission 312 that is detected at a detector 330. The detected photoemission 312 is used to identify the location of the defective transistor as being below the position of the EFM probe tip 320 when the photoemission was generated.

Figure 3B:
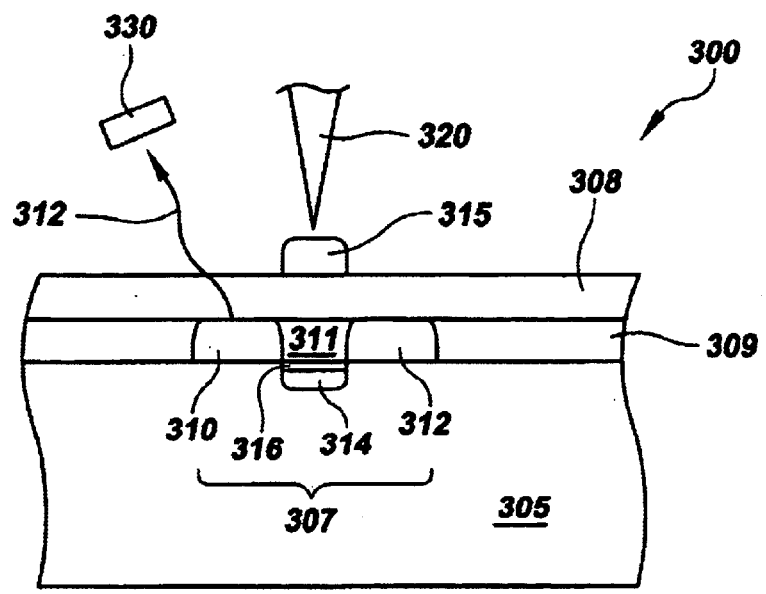
FIG. 3B is a semiconductor die, similar to the die shown in FIG. 3A but without necessarily having SOI structure and undergoing analysis, according to another example embodiment of the present invention.

FIG. 3B shows the semiconductor die 300 of FIG. 3A undergoing similar analysis, with an electric field being applied via conductive material 315 formed on the insulator 308 and adjacent to the channel region 311, according to another example embodiment of the present invention. The conductive material 315 may include one or more of a variety of types of material, including those commonly used for gate electrodes (e.g., doped polysilicon). As the EFM probe tip 320 applies a signal to the conductive material 315, the channel region 311 is biased and the transistor 307 is switched between electrical states, which generates the photoemission 312. In one implementation, the EFM probe tip 320 contacts the conductive material 315. In another implementation, the conductive material 315 includes a wire formed on the insulator 308.

Figure 4:
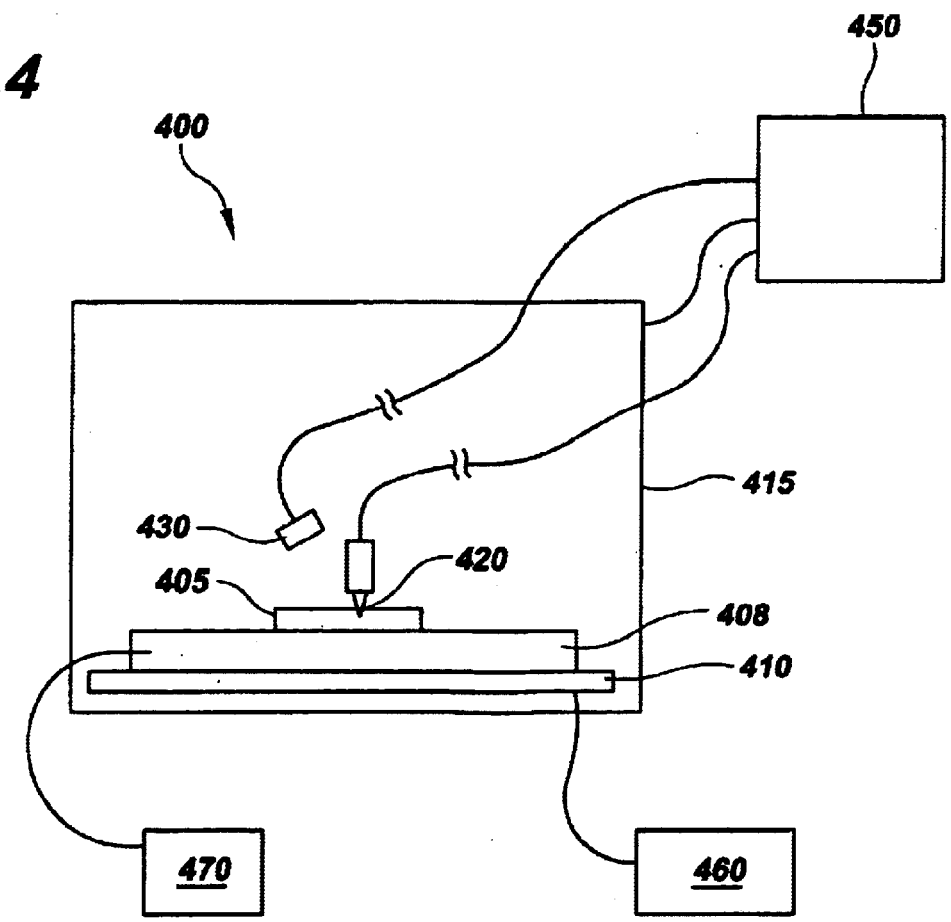
FIG. 4 is a system for analyzing a semiconductor die, according to another example embodiment of the present invention.

FIG. 4 is a system 400 for analyzing a semiconductor die, such as the dies discussed in connection with FIGS. 3, 3A and 3B, according to another example embodiment of the present invention. The system includes an EFM probing arrangement 415 having a stage 410 adapted to hold a semiconductor die 405 in a DUT board 408. A power supply 460 is used to operate the die 405 under selected conditions, such as normal die operating conditions and/or under conditions known to cause a failure. The EFM probing arrangement 415 is controlled with a controller 450 that is adapted to effect a scan of the die 405 with an EFM probe tip 420 for stimulating the die 405. The position of the EFM probe tip 420 during the scan is controlled in one of either a spot mode or a scanning mode. In the spot mode, the tip is moved to a particular position over circuitry in the die 405, and is particularly useful for stimulating a specific circuit node in the die 405, and for contacting conductive material on the die 405 (e.g., as discussed in connection with FIG. 3B). In the scanning mode, the tip is scanned across the die. The positioning of the EFM probe tip 420 can be accomplished, for example, using an x-y positioning arrangement (not shown), such as those commonly used in microscopy applications. The tip can be controllably moved vertically using a Piezo-Z stage and can also be configured so that the tip-to-sample distance can be maintained at a specific distance during the scan.

The stimulation of the die by the EFM probe tip 420 generates a response that includes a photoemission, and a photo-detector 430 is arranged for detecting the photoemission. The photo-detector 430 may include one or more of a variety of devices, such as an avalanche photodiode, a fiber optic cable, a photomultiplier tube or an emission camera. A testing arrangement 470 is optionally electrically coupled to the die 405 for detecting a response of the die to the electric field, in addition to the photoemission response. Example EFM arrangements that can be adapted for implementation in connection with the present invention include those available from Digital Instruments located at 112 Robin Hill Rd., Santa Barbara, Calif. 93117.

The controller 450 is adapted to operate the probing arrangement in a variety of manners, such as those described hereinabove and including a varying voltage mode, where a voltage signal to the EFM probe tip 420 is varied over time in a manner that causes a response in circuitry in the die 405. The controller 405 is also optionally adapted and communicatively coupled to provide a control signal to the power supply 460. The control signal is selected to effect a desired operation of the die, such as to cause the die to operate in a known failure condition or to undergo a state-changing operation. In addition, the controller 450 is further optionally coupled to the photo-detector 430 and/or to the testing arrangement 470 and used to record a response of the die 405. The controller 450 further optionally includes a computer arrangement for correlating the response to the position of the probe tip 420. The correlation may, for example, be used to map the location of the probe tip to a particular circuit node from which the response was generated and to generate an image showing the portion of the die 405 from which the photoemission was detected, as discussed above.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having circuitry therein, the method comprising:

applying an electric field to the die via an electric-field tool, separate from the die and using the applied electric field to stimulate circuitry in the die including scanning the electric-field tool across the die wherein prior to applying the electric field to the die, applying signals to inputs of the die and thereby operating the die;

detecting a photoemission response of die to the applied electric field wherein detecting a photoemission response includes detecting responses from a plurality of circuit nodes in the die to both the applied signals and to the applied electric field;

mapping the responses of the plurality of circuit nodes to a circuit diagram of the die and thereby forming a mapped image of the responses; and using the photoemission response to detect an electrical characteristic of the die including using the mapped image to detect electrical characteristics of at least one of the plurality of nodes.

2. The method of claim 1, wherein detecting a photoemission response includes obtaining an electric signal that represents the photoemission response, further comprising:

integrating the electric signal over time while the electric-field tool is being scanned across the die; and wherein mapping the responses of the plurality of circuit nodes to a circuit diagram of the die includes using the integrated signal to create an image of the photoemission responses.

3. The method of claim 2, further comprising:

simultaneously obtaining an image of the die while detecting a photoemission response of the die; and wherein mapping the responses of the plurality of circuit nodes to a circuit diagram includes mapping the responses of the plurality of circuit nodes to the obtained image of the die.

4. The method of claim 3, wherein simultaneously obtaining an image of the die includes collecting light with a fiber optic tip.

5. A method for analyzing a semiconductor die having circuitry therein, the method comprising:

applying signals to inputs of the die and thereby operating the die;

halting the operation of the device at a test state;

applying an electric field to the die via an electric-field tool, separate from the die and using the applied electric field to stimulate circuitry in the die;

detecting a photoemission response of die to the applied electric field; and using the photoemission response to detect an electrical characteristic of the die wherein using the photoemission response to detect an electrical characteristic of the die includes using the photoemission response to detect a change in the state of a circuit node in the die, the change in state being responsive to the applied electric field.

6. A method for analyzing a semiconductor die having circuitry therein, the method comprising:

applying signals to inputs of the die and thereby operating the die;

applying an electric field to the die via a scanning electric-field microscopy tool, separate from the die and using the applied electric field to stimulate circuitry in the die;

detecting a photoemission response of die to the applied electric field and to the applied signals; and using the photoemission response to detect an electrical characteristic of the die.

7. The method of claim 6, wherein applying an electric field includes applying an electric field to circuitry via a die passivation layer in a conventionally packaged semiconductor die.

8. The method of claim 6, wherein applying an electric field includes applying an electric field to circuitry via a backside of a flip-chip packaged die.

9. The method of claim 8, wherein applying an electric field to circuitry via a backside of a flip-chip packaged die includes applying an electric field via a thinned backside of the flip-chip packaged die.

10. The method of claim 9, further comprising thinning the backside of the flip-chip packaged die and thereby forming the thinned backside.

11. The method of claim 6, wherein applying an electric field includes applying an electric field to circuitry via an insulator portion of silicon-on-insulator structure in a die.

12. The method of claim 11, further comprising thinning a portion of the die and exposing the insulator portion of the silicon-on-insulator structure, wherein applying an electric field to circuitry via the insulator portion includes applying the electric field via the exposed insulator portion.

13. The method of claim 6, wherein applying the electric field includes using an electric force microscope.

14. The method of claim 6, wherein applying an electric field includes applying the electric field to control current flow in a channel region between two active regions in the die.

15. The method of claim 6, wherein applying the electric field includes altering an electrical state of a circuit node in the die.

16. The method of claim 6, wherein applying an electric field includes applying the electric field to circuitry via a layer in the die, the circuitry being buried in the die below the layer.

17. The method of claim 6, further comprising:

using the detected electrical characteristic to provide a modified die design; and manufacturing a semiconductor device using the modified die design.

18. A semiconductor device manufactured using the modified die design of claim 17.

19. The method of claim 6, further comprising using the detected electrical characteristic to modify a manufacturing process for the die and subsequently using the modified manufacturing process to manufacture additional dies.

20. The method of claim 6, wherein using the photoemission response to detect an electrical characteristic of the die includes using the photoemission response to detect a timing characteristic of the die.

21. The method of claim 20, further comprising:

applying operating signals to inputs of the die and operating the die;

wherein applying an electric field to the die includes slowing down a response of the die to the applied operating signals; and wherein using the photoemission response to detect a timing of the die includes using the photoemission response to detect a circuit malfunction due to the slowed response of the die via the applied electric field.

22. The method of claim 21, wherein applying operating signals to inputs of the die includes operating the die in a loop and wherein detecting a photoemission response includes detecting a state transition of the die, further comprising:

comparing the timing of the state transition to a reference time, wherein a difference in the compared times being greater than a threshold difference is indicative of a circuit failure.

23. The method of claim 6, further comprising:

depositing conductive material on the die; and wherein applying an electric field to the die via an electric-field tool includes applying a voltage to the conductive material.

24. The method of claim 6, wherein applying an electric field to the die includes applying an electric field that depletes carriers from a channel region of a transistor and prevents the channel from being biased to a conducting state in response to internal signals applied to a gate of the transistor.

25. A system for analyzing a semiconductor die having circuitry therein, the system comprising:

means for applying signals to inputs of the die and thereby operating the die;

means, separate from the die and adapted for applying an electric field to the die and for using the applied electric field to stimulate circuitry in the die;

means for detecting a photoemission response of die to the applied electric field and to the applied signals; and means for using the photoemission response to detect an electrical characteristic of the die.

26. A system for analyzing a semiconductor die having circuitry therein, the system comprising:

a scanning electric-field microscopy probe tip arrangement, separate from the die and adapted for applying an electric field to the die for stimulating circuitry in the die;

a photoemission detector adapted for detecting a photoemission response of die to the applied electric field; and a computer arrangement adapted for using the detected photoemission response to detect an electrical characteristic of the die.

* * * * *